(12) United States Patent
Lin et al.

(10) Patent No.: US 7,928,458 B2
(45) Date of Patent: Apr. 19, 2011

(54) LIGHT-EMITTING DIODE DEVICE AND METHOD FOR FABRICATING THE SAME

(75) Inventors: Tzu-Han Lin, Hsinchu (TW); Jui-Ping Weng, Miaoli (TW); Shin-Chang Shiung, Taichung (TW)

(73) Assignee: VisEra Technologies Company Limited, Hsinchu (TW)

( * ) Notice: Subject to any disclaimer, the term of this patent is extended or adjusted under 35 U.S.C. 154(b) by 213 days.

(21) Appl. No.: 12/173,565

(22) Filed: Jul. 15, 2008

(65) Prior Publication Data
US 2010/0012957 A1    Jan. 21, 2010

(51) Int. Cl.
*H01L 33/00* (2010.01)
(52) U.S. Cl. .............. 257/98; 257/99; 257/E33.067; 438/27; 438/29; 438/33; 438/42
(58) Field of Classification Search ............. 257/98, 257/99, E33.067; 438/27, 29, 33, 42
See application file for complete search history.

(56) References Cited

U.S. PATENT DOCUMENTS

| 5,959,316 | A | 9/1999 | Lowery |
| 6,576,488 | B2 | 6/2003 | Collins, III et al. |
| 2005/0212405 | A1* | 9/2005 | Negley .................. 313/502 |
| 2005/0274959 | A1* | 12/2005 | Kim et al. ................. 257/79 |
| 2008/0093617 | A1* | 4/2008 | Song et al. ................ 257/98 |
| 2009/0026472 | A1* | 1/2009 | Yasuda et al. ............ 257/98 |
| 2009/0045422 | A1* | 2/2009 | Kato et al. ............... 257/98 |

FOREIGN PATENT DOCUMENTS
CN      2729906        9/2005

* cited by examiner

*Primary Examiner* — Tu-Tu V Ho
(74) *Attorney, Agent, or Firm* — Muncy, Geissler, Olds & Lowe, PLLC

(57) ABSTRACT

A semiconductor device is disclosed. The semiconductor device comprises a light-emitting diode chip disposed in a cavity of a semiconductor substrate. At least two isolated outer wiring layers are disposed on the bottom surface of the semiconductor substrate and are electrically connected to the light-emitting diode chip, serving as input terminals. A lens module is adhered to the top surface of the semiconductor substrate to cap the cavity, in which the lens module comprises a molded lens and a molded fluorescent layer thereunder and the molded fluorescent layer faces the light-emitting diode chip. A method for fabricating the semiconductor devices is also disclosed.

11 Claims, 10 Drawing Sheets

LIGHT-EMITTING DIODE DEVICE AND METHOD FOR FABRICATING THE SAME

BACKGROUND OF THE INVENTION

1. Field of the Invention

The invention relates to a light-emitting diode (LED) device and more particularly to LED devices with a lens module having a fluorescent material and methods for fabricating the same.

2. Description of the Related Art

Light-emitting diode (LED) devices are solid-state light sources and have been known for years. The LED devices are based on the recombination of electron-hole pairs in a pn-junction in a semiconductor material which is forward-biased. Advantages of LED devices compared with traditional lamps are lower power consumption and longer lifespan. In particular, because white light LED devices have high color rendering index (CRI), it has become one of the most popular illuminating devices used.

A white light LED device can be obtained by mixing red, green, and blue lights using a combination of a red light LED chip (or die), a green light LED chip, and a blue light LED chip to form the white light LED device. However, the above three-in-one white light LED device is expensive because it requires three LED chips for different emitted lights. Moreover, the CRI is reduced due to different light-emitting efficiencies for each of the three LED chips.

In order to address the above drawbacks, a white light LED device has been developed by using a combination of a blue light LED device combined with a fluorescent material, such as a phosphor material. The blue light passes through the fluorescent red and green phosphor material, such that the combination of blue, red, and green lights produces a white light. Currently, such a white light LED device is formed by filling an epoxy resin containing phosphors around a blue light LED chip and then a lens is capped thereon. However, poor uniformity of the filled epoxy resin reduces the light-emitting properties of the LED devices. Another method to form the white light LED device is to fill a transparent protective resin or glue around a blue light LED chip followed by coating an epoxy resin layer containing phosphors thereon and capping a lens on top. However, the coating rate of the epoxy resin layer is slow and it is also difficult to control the uniformity of the epoxy resin layer. Further another method to form the white light LED device is to form a lens on a blue light LED chip followed by coating an epoxy resin layer containing phosphors thereon and covering the lens with a transparent protective resin or glue. However, the coating rate of the epoxy resin layer is also slow and the manufacturing cost is high.

Therefore, there is a need to develop a novel LED device capable of addressing the above problems.

BRIEF SUMMARY OF TIE INVENTION

A detailed description is given in the following embodiments with reference to the accompanying drawings. A semiconductor device and a method for fabricating the same are provided. An embodiment of a semiconductor device comprises a semiconductor substrate having a cavity. A light-emitting diode chip disposed in the cavity of the semiconductor substrate. At least two isolated outer wiring layers are disposed on the bottom surface of the semiconductor substrate and are electrically connected to the light-emitting diode chip, serving as input terminals. A lens module is adhered to the top surface of the semiconductor substrate to cap the cavity, in which the lens module comprises a molded lens and a molded fluorescent layer thereunder and the molded fluorescent layer faces the light-emitting diode chip.

An embodiment of a method for fabricating semiconductor devise comprises providing a semiconductor wafer comprising a plurality of cavities and a plurality of light-emitting diode chips in the corresponding cavities. The plurality of cavities of the semiconductor wafer is capped with a lens plate, in which the lens plate comprises a plurality of molded lenses, a plurality of molded fluorescent layers under the corresponding molded lenses and the molded fluorescent layer faces the and faces the corresponding light-emitting diode chips, and a glass wafer interposed between the plurality of molded fluorescent layers and the plurality of molded lenses. The bottom surface of the semiconductor wafer is etched to form a plurality of notches between the adjacent cavities to form individual semiconductor substrates. The lens plate is cut from the plurality of notches to form individual lens modules on the corresponding semiconductor substrates.

Another embodiment of a method for fabricating semiconductor devises comprises providing a semiconductor wafer comprising a plurality of cavities and a plurality of light-emitting diode chips in the corresponding cavities. Each cavity of the semiconductor wafer is capped with a lens module, in which each lens module comprises a molded lens and a molded fluorescent layer thereunder and the molded fluorescent layer faces the light-emitting diode chip. The semiconductor wafer between the adjacent cavities is cut to form individual semiconductor substrates with the corresponding lens module.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 3A:
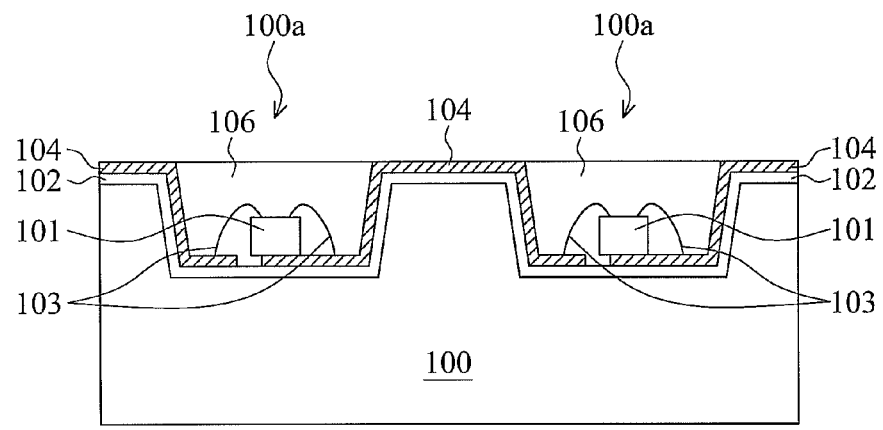
FIGS. 3A to 3D are cross sections of an exemplary embodiment of a method for fabricating LED devices according to the invention.
Figure 3B:
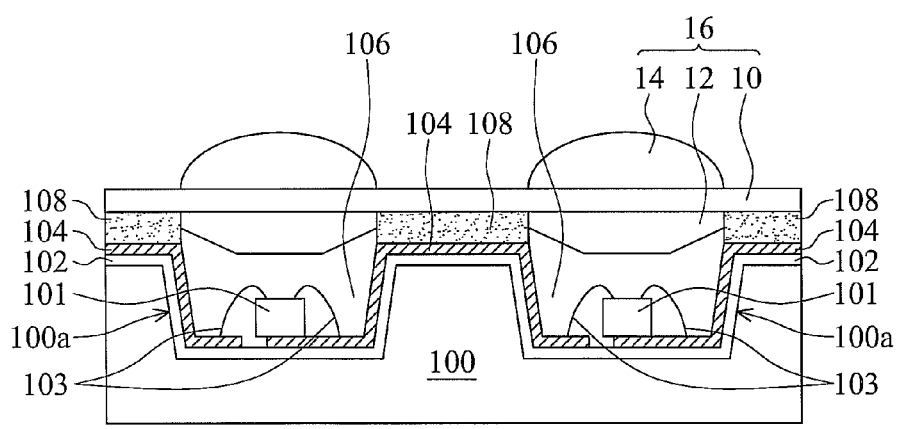
Figure 3C:
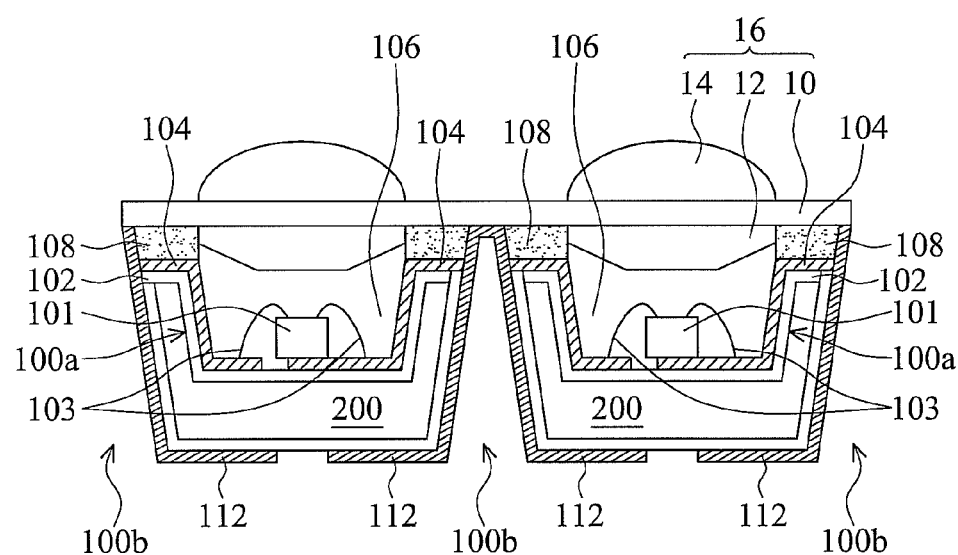
Figure 3D:
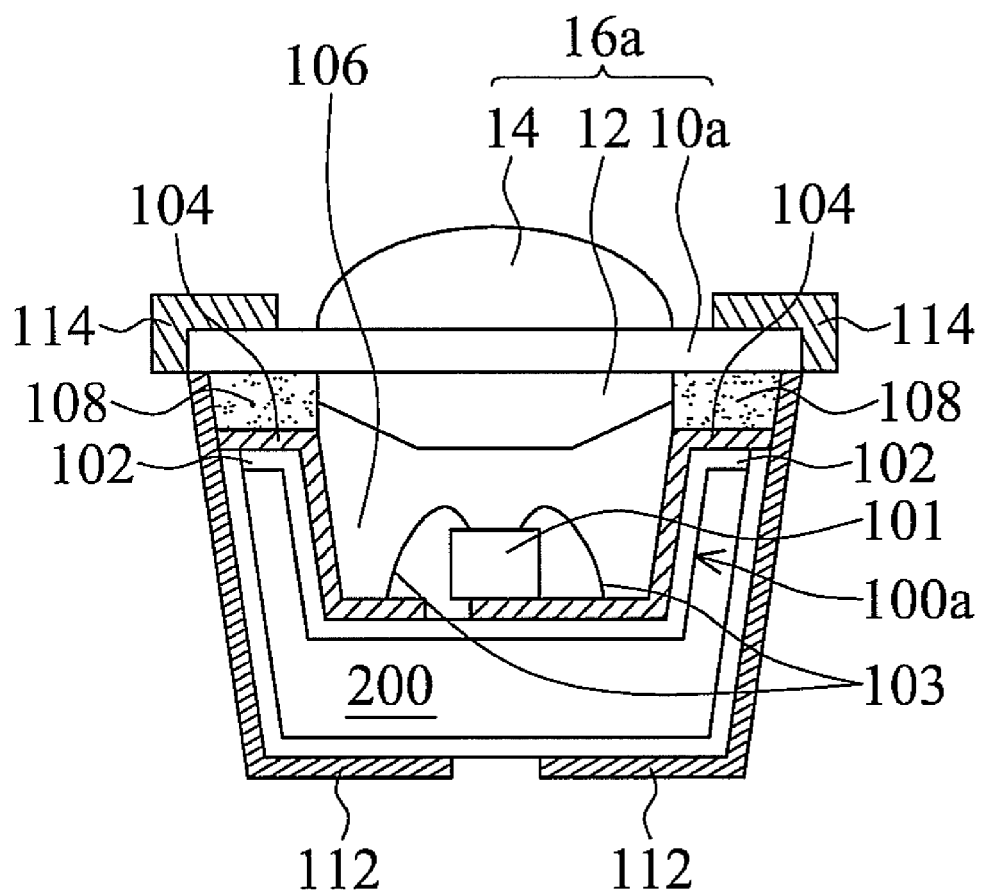
Figure 4A:
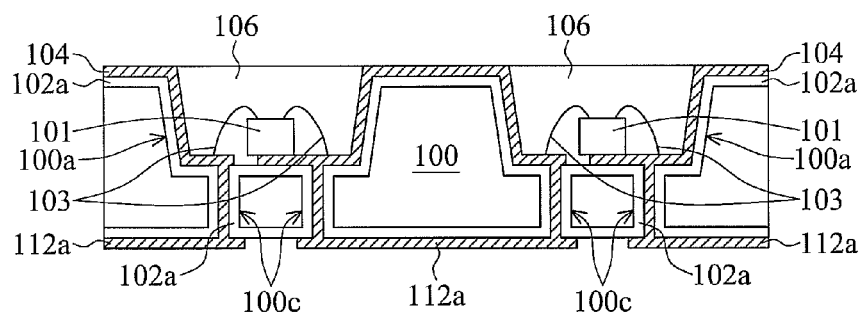
FIGS. 4A to 4D are cross sections of another exemplary embodiment of a method for fabricating LED devices according to the invention.
Figure 4B:
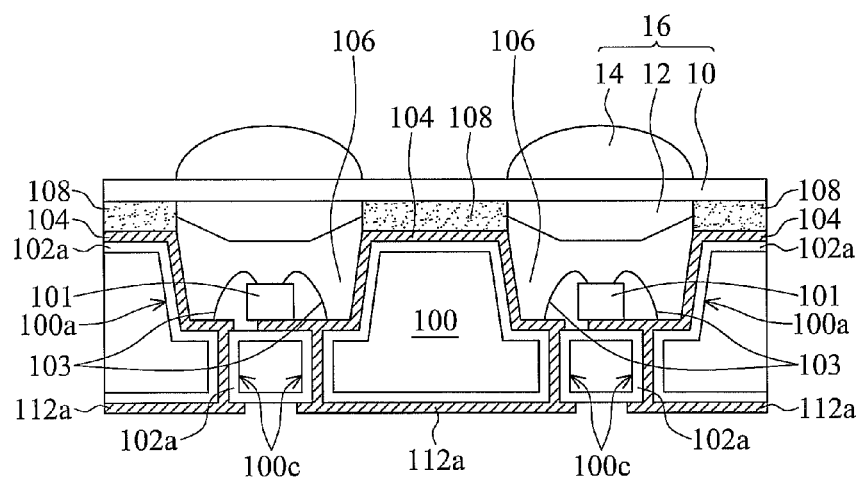
Figure 4C:
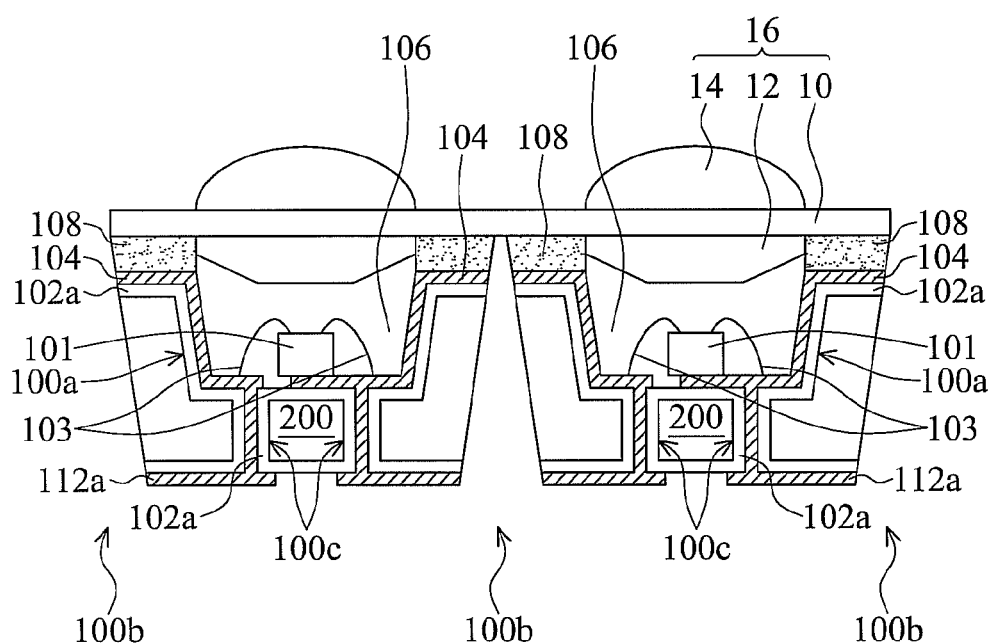
Figure 4D:
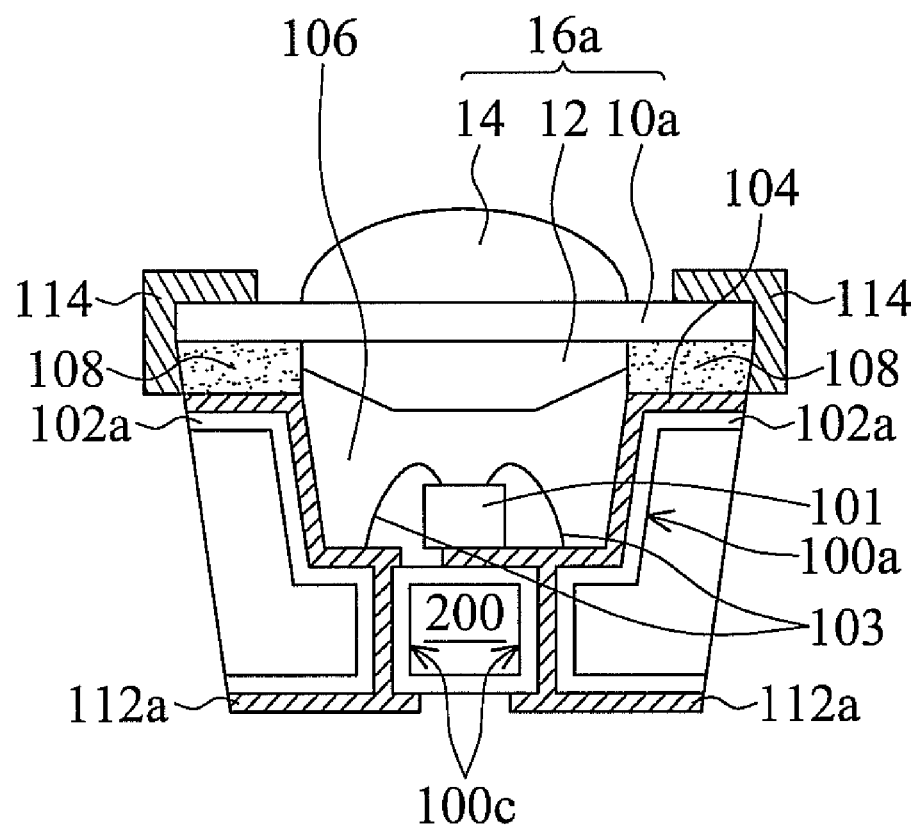
Figure 5A:
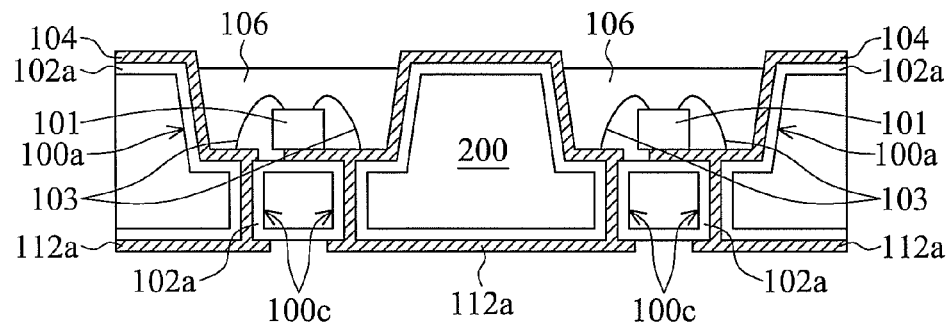
FIGS. 5A to 5C are cross sections of yet another exemplary embodiment of a method for fabricating LED devices according to the invention.
Figure 5B:
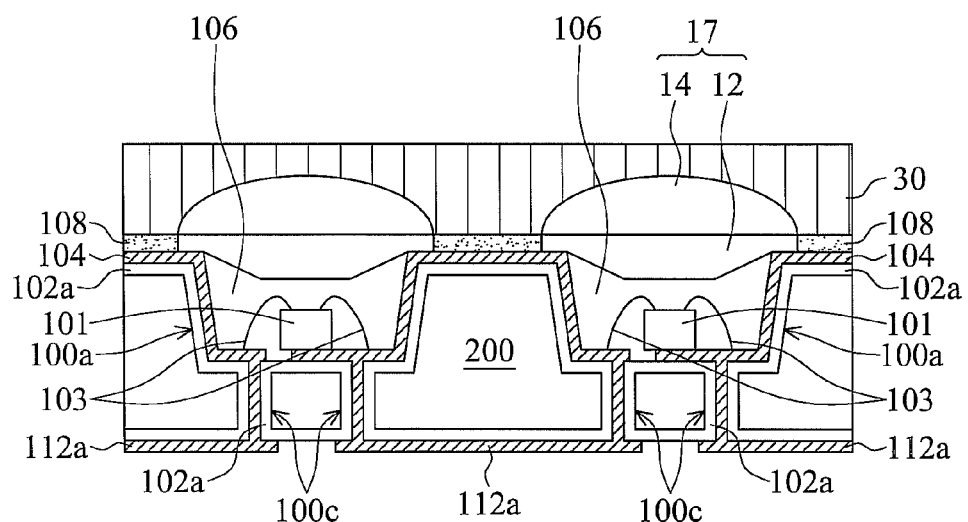
Figure 5C:
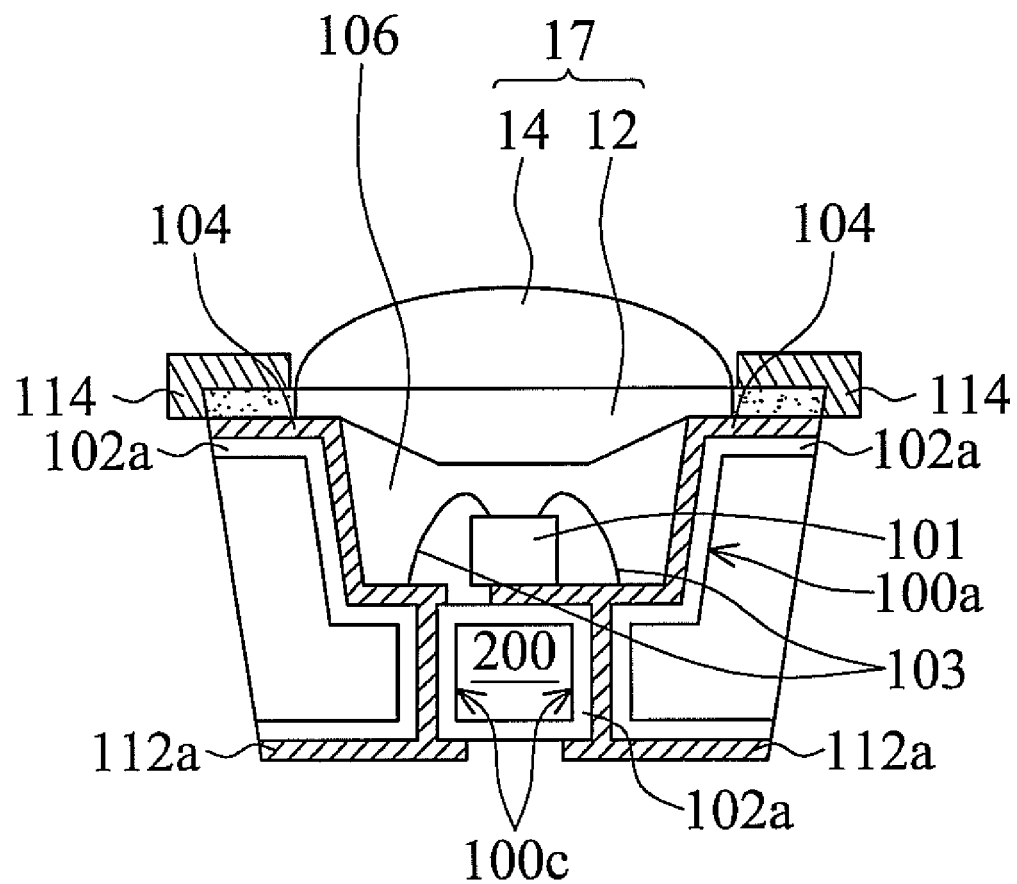

FIGS. 3D, 4D and 5C, are cross sections of various exemplary embodiments of LED devices according to the invention, respectively. Elements in FIGS. 4D and 5C that are the same as those in FIG. 3D are labeled with the same reference numbers as in FIG. 3D and are not described again for brevity. Referring to FIG. 3D, the LED device comprises a semiconductor substrate 200, such as a silicon substrate or other semiconductor substrates well known in the art, having a cavity 100a. The semiconductor substrate 200 may contain a variety of elements, including, for example, transistors, resistors, and other semiconductor elements well known in the art. In order to simplify the diagram, the variety of elements is not depicted. At least two isolated inner wiring layers 104 are disposed in the cavity 100a. A light-emitting diode (LED) chip 101, such as a blue light LED chip (or die), is disposed in the cavity 100a and is electrically connected to the inner wiring layers 104 by wire bonding through wiring lines 103. In another embodiment, the LED chip 101 can be electrically connected to the inner wiring layers 104 by a flip chip method. At least two isolated outer wiring layers 112 are disposed on the bottom surface of the semiconductor substrate 200, serving as input terminals. In the embodiment, the outer wiring layers 112 extend to sidewalls of the semiconductor substrate 200 and the inner wiring layers 104 extend to the top surface of the semiconductor substrate, such that the outer wiring layers 112 are directly connected to the inner wiring layers 104, respectively, so as to be electrically connected to the LED chip 101. A lens module 16a is adhered to the top surface of the semiconductor substrate 200 by an adhesion layer 108, to cap the cavity 100a. In the embodiment, the lens module 16a comprises a molded lens 14, a molded fluorescent layer 12 under the molded lens 14 and the molded fluorescent layer 12 faces the LED chip 101. In addition, a glass substrate 10a is interposed between the molded fluorescent layer 12 and the molded lens 14. The molded fluorescent layer 12 may comprise phosphor. Moreover, the central portion of the molded fluorescent layer 12 has a thickness thicker than that of the edge portion of the molded fluorescent layer 12, such that the correlated color temperature (CCT) of the emitted light through the molded fluorescent layer 12 can be more uniform. A reflective layer 114, such as Ag metal or well reflective material, can be coated on the edge of the lens module 16a for prevention of light leakage. Thus, brightness of the LED device can be increased.

Referring to FIG. 4D, unlike the LED device shown in FIG. 3D, the semiconductor device 200 may comprise at least two through openings 100c under the cavity 100a, such that at least two outer wiring layers 112a are electrically connected to the inner wiring layers 104 by the through openings 100c, respectively.

Referring to FIG. 5C, unlike the LED device shown in FIG. 4D, the molded fluorescent layer 12 is directly adhered under the molded lens 14 without the glass substrate 10a interposed therebetween.

Referring to FIGS. 3A to 3D, which are cross sections of an exemplary embodiment of a method for fabricating LED devices according to the invention. As shown in FIG. 3A, a semiconductor wafer 100, such as a silicon wafer or other semiconductor wafers well known in the art, is provided. The semiconductor wafer 100 comprises a plurality of cavities 100a adjacent to each other. In order to simplify the diagram, only two adjacent cavities 100a are depicted.

An insulating layer 102, such as a silicon oxide layer formed by thermal oxidation, chemical vapor deposition (CVD) or other conventional deposition, and a metal layer (not shown) are successively and conformally formed on the top surface of the semiconductor wafer 100 and the inner surface of each cavity 100a. The metal layer may comprise aluminum (Al), copper (Cu), nickel (Ni), aurum (Au), or argentum (Ag) or alloys thereof. Moreover, the metal layer is then patterned by a lithography and etching process to form at least two isolated inner wiring layers 104 in each cavity 100a. The inner wiring layers 104 also extend to the top surface of the semiconductor wafer 100.

A plurality of LED chips 102 are correspondingly provided in the plurality of cavities 100a and is electrically connected to the corresponding inner wiring layers 104 by wire bonding through wiring lines 103 or by a flip chip method through bumps (not shown). A transparent resin 106, such as epoxy or glue, may be optionally filled into each cavity 100a to cover and protective each light-emitting diode chip 101.

Figure 1A:
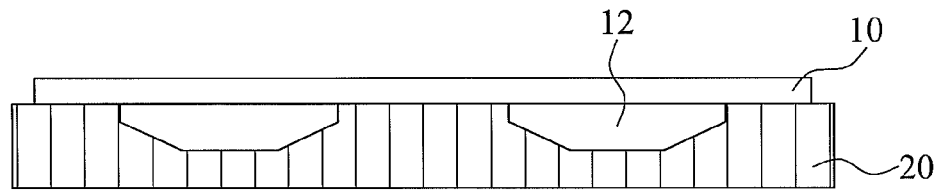
FIGS. 1A to 1C are cross sections of an exemplary embodiment of a method for fabricating a lens plate according to the invention.
Figure 1B:
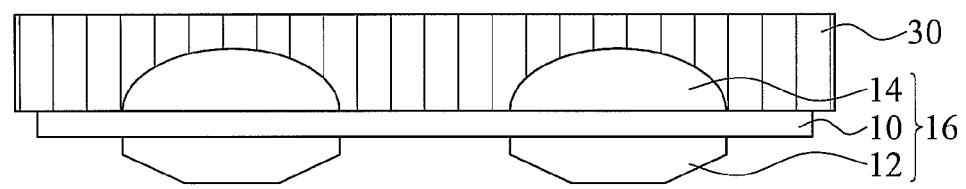
Figure 1C:
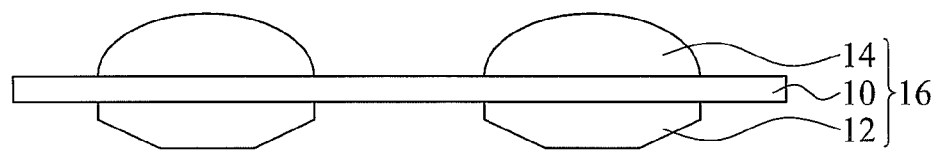

As shown in FIG. 3B, the plurality of cavities 100a of the semiconductor wafer 100 is capped with a lens plate 16 by an adhesion layer 108, such as an epoxy layer. FIGS. 1A to 1C, are cross sections showing a method for fabricating the lens plate 16. In FIG. 1A, a glass wafer 10 is provided. A plurality of molded fluorescent layers 12, such as phosphor layers, is formed on the bottom surface of the glass wafer 10 by a mold 20 and arranged as an array. The plurality of molded fluorescent layers 12 corresponds to the plurality of cavities 100a shown in FIG. 3A. In order to simplify the diagram, only two adjacent molded fluorescent layers 12 are depicted. Since the fluorescent layer 12 is formed by molding, the profile of fluorescent layer 12 can be easily controlled. In the embodiment, the central portion of the molded fluorescent layer 12 has a thickness thicker than that of the edge portion thereof. In FIG. 1B, after removal of the mold 20, a plurality of molded lenses 14 comprising, for example, a resin material, is formed on the top surface of the glass wafer 10 corresponding to the plurality of molded fluorescent layers 12 by a mold 30, such that the glass wafer 10 is interposed between each molded fluorescent layers 12 and each molded lens 14. After removal of the mold 30, a lens plate 16 is completed, as shown in FIG. 1C. Each molded fluorescent layer 12 of the lens plate 16 faces to the corresponding LED chip 101 after the lens plate 16 is adhered to the semiconductor wafer 100. The semiconductor wafer 100 is thinned by grinding the bottom surface thereof.

As shown in FIG. 3C, the grounded bottom surface of the semiconductor wafer 100 and the overlying adhesion layer 108 are successively etched to form a plurality of notches 100b between the adjacent cavities 100a to form individual semiconductor substrates 200 and expose the glass wafer 10. At least two isolated outer wiring layers 112 is formed on the bottom surface of each semiconductor substrate 200 by deposing a metal layer (not shown) followed by a lithography and etching process. The outer wiring layers 112 may comprise the same or similar material as the inner wiring layers 104. In the embodiment, the outer wiring layers 112 serve as input terminals and extend to sidewalls of each semiconductor substrate 200 and the exposed glass wafer 10, such that the two outer wiring layers 112 are directly connected to the corresponding inner wiring layers 104 and are electrically connected to the corresponding LED chip 101. In some embodiments, the molded lenses 14 can be formed on the glass wafer 10 after grinding the bottom surface of the semiconductor wafer 100, forming notches 100b, and forming the isolated outer wiring layers 112.

As shown in FIG. 3D, the lens plate 16 is cut from the plurality of notches 100b to form individual lens modules 16a on the corresponding semiconductor substrates 200. In order to simplify the diagram, only a semiconductor substrate 200 having a lens module 16a thereon is depicted. Next, the edge of each lens module 16a is coated with a reflective layer 114 for prevention of light leakage, thereby increasing brightness of the LED chips 101. As a result, LED devices of this embodiment are completed.

Referring to FIGS. 4A to 4D, which are cross sections of another exemplary embodiment of a method for fabricating LED devices according to the invention. Elements in FIGS. 4A to 4D that are the same as those in FIGS. 3A to 3D are labeled with the same reference numbers as in FIGS. 3A to 3D and are not described again for brevity. As shown in FIG. 4A, a semiconductor wafer 100 comprising a plurality of cavities 100a adjacent to each other and at least two through openings 100c under each cavity 100a is provided.

An insulating layer 102a, such as a silicon oxide layer formed by thermal oxidation, chemical vapor deposition (CVD) or other conventional deposition, is conformally formed on the top and bottom surfaces of the semiconductor wafer 100, the inner surface of each cavity 100a, and the inner surface of each through openings 100c. Next, two metal layers (not shown) is conformally formed on the insulating layer 102a overlying the top and bottom surfaces of the semiconductor wafer 100, respectively, and fill the through openings 100c. The metal layers are then patterned by a lithography and etching process to form at least two isolated inner wiring layers 104 in each cavity 100a and at least two isolated outer wiring layers 112a on the semiconductor wafer 100 under each cavity 100a. Thus, the two outer wiring layers 112a under each cavity 100a are electrically connected to the corresponding inner wiring layers 104 by the through openings 100c.

As shown in FIG. 4B, the plurality of cavities 100a of the semiconductor wafer 100 is capped with a lens plate 16 shown in FIG. 1C.

As shown in FIG. 4C, the bottom surface of the semiconductor wafer 100 and the overlying adhesion layer 108 are successively etched to form a plurality of notches 100b between the adjacent cavities 100a to form individual semiconductor substrates 200 and expose the glass wafer 10.

As shown in FIG. 4D, the lens plate 16 is cut from the plurality of notches 100b to form individual lens modules 16a on the corresponding semiconductor substrates 200. Also, the edge of each lens module 16a is coated with a reflective layer 114 for prevention of light leakage. As a result, LED devices of this embodiment are completed.

Referring to FIGS. 5A to 5C, which are cross sections of yet another exemplary embodiment of a method for fabricating LED devices according to the invention. Elements in FIGS. 5A to 5C that are the same as those in FIGS. 4A to 4D are labeled with the same reference numbers as in FIGS. 4A to 4D and are not described again for brevity. As shown in FIG. 5A, a semiconductor wafer 100 having a structure shown in FIG. 4A is provided.

Figure 2A:
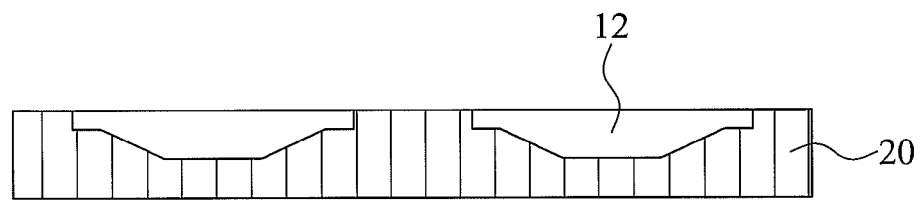
FIGS. 2A to 2B are cross sections of another exemplary embodiment of a method for fabricating lens modules according to the invention.
Figure 2B:
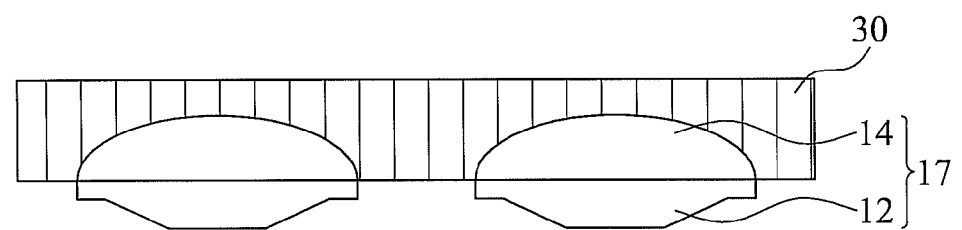

As shown in FIG. 5B, each cavity 100a of the semiconductor wafer 100 is capped with a lens module 17 by an adhesion layer 108. FIGS. 2A to 2B, are cross sections of an exemplary embodiment of a method for fabricating lens modules 17. Elements in FIGS. 2A to 2B that are the same as those in FIGS. 1A to 1C are labeled with the same reference numbers as in FIGS. 1A to 1C and are not described again for brevity. In FIG. 2A, a mold 20 having a plurality of fluorescent layers 12 is provided. In FIG. 2B, the mold of a plurality of molded lenses 14 is correspondingly formed on the plurality of molded fluorescent layers 12 by a mold 30. Next, the mold 20 is removed.

As shown in FIG. 5C, after removal of the mold 30, the semiconductor wafer 100 between the adjacent cavities 100a is cut to form individual semiconductor substrates 200 with the corresponding lens module 17. Also, the edge of each lens module 17 is coated with a reflective layer 114 for prevention of light leakage. As a result, LED devices of this embodiment are completed.

According to the aforementioned embodiments, the fluorescent layers are formed on an additional glass carrier. Compared to the conventional fluorescent layer filled around an LED chip, uniformity of the fluorescent layer can be improved. Moreover, since the fluorescent layers are formed by molding, good profile control of the fluorescent layer can be obtained. Furthermore, the lens and the fluorescent layer formed on opposing sides of a glass carrier by molding are easily reworkable, thus reducing manufacturing costs. Additionally, since the LED devices are packaged by a wafer level package, high production rate can be obtained.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a semiconductor substrate having a cavity;
   a light-emitting diode chip disposed in the cavity;
   at least two isolated outer wiring layers disposed on the bottom surface of the semiconductor substrate and electrically connected to the light-emitting diode chip, serving as input terminals; and
   a lens module adhered to the top surface of the semiconductor substrate to cap the cavity, comprising:
   a molded lens;
   a molded fluorescent layer under the molding lens, having a convex surface facing the light-emitting diode chip; and
   a glass substrate interposed between the molded fluorescent layer and the molded lens.

2. The semiconductor device of claim 1, wherein the central portion of the molded fluorescent layer has a thickness thicker than that of the edge portion of the molded fluorescent layer.

3. The semiconductor device of claim 1, further comprising a reflective layer coated on the edge of the lens module.

4. The semiconductor device of claim 1, further comprising at least two isolated inner wiring layers disposed in the cavity, electrically connecting between the light-emitting diode chip and the isolated outer wiring layers.

5. The semiconductor device of claim 4, wherein the semiconductor substrate comprises at least two through openings under the cavity, such that the outer wiring layers are electrically connected to the inner wiring layers by the through openings, respectively.

6. The semiconductor device of claim 4, wherein the outer wiring layers extend to sidewalls of the semiconductor substrate and the inner wiring layers extend to the top surface of the semiconductor substrate, such that the outer wiring layers are directly connected to the inner wiring layers, respectively.

7. The semiconductor device of claim 1, further comprising a transparent resin filled into the cavity to cover the light-emitting diode chip.

8. A semiconductor device, comprising:
   a semiconductor substrate having a cavity;
   a light-emitting diode chip disposed in the cavity;
   at least two isolated outer wiring layers disposed on the bottom surface of the semiconductor substrate and electrically connected to the light-emitting diode chip, serving as input terminals;

at least two isolated inner wiring layers disposed in the cavity, electrically connecting between the light-emitting diode chip and the isolated outer wiring layers;

a lens module adhered to the top surface of the semiconductor substrate to cap the cavity, comprising:

a molded lens; and a molded fluorescent layer under the molding lens, having a convex surface facing the light-emitting diode chip;

wherein the semiconductor substrate comprises at least two through openings under the cavity, such that the outer wiring layers are electrically connected to the inner wiring layers by the through openings, respectively.

9. The semiconductor device of claim 8, wherein the central portion of the molded fluorescent layer has a thickness thicker than that of the edge portion of the molded fluorescent layer.

10. The semiconductor device of claim 8, further comprising a reflective layer coated on the edge of the lens module.

11. The semiconductor device of claim 8, further comprising a transparent resin filled into the cavity to cover the light-emitting diode chip.

* * * * *